(12) United States Patent  
Song

(10) Patent No.: US 8,742,816 B2  
(45) Date of Patent: Jun. 3, 2014

(54) DELAY CIRCUIT AND DELAY METHOD USING THE SAME

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/716,816

(22) Filed: Dec. 17, 2012

(65) Prior Publication Data

US 2014/0002164 A1   Jan. 2, 2014

(30) Foreign Application Priority Data

Jun. 28, 2012 (KR) .................. 10-2012-0069685

(51) Int. Cl.
*H03H 11/26* (2006.01)

(52) U.S. Cl.
USPC ............. 327/269; 327/99; 327/276; 327/298

(58) Field of Classification Search
CPC ........ H03K 5/132; H03K 5/133; H03K 5/135
USPC ............ 327/99, 269, 271–272, 276, 277, 298
See application file for complete search history.

(56) References Cited

U.S. PATENT DOCUMENTS

| | | | |
|---|---|---|---|
| 6,580,312 B1 * | 6/2003 | Kim | 327/536 |
| 7,180,961 B2 * | 2/2007 | Matsuno et al. | 375/316 |
| 2013/0169337 A1 * | 7/2013 | Shin | 327/276 |

FOREIGN PATENT DOCUMENTS

| | | |
|---|---|---|
| KR | 1020040108014 | 12/2004 |
| KR | 1020090067799 | 6/2009 |
| KR | 1020110037208 | 4/2011 |
| KR | 1020120119348 | 10/2012 |

* cited by examiner

*Primary Examiner* — An Luu  
(74) *Attorney, Agent, or Firm* — IP & T Group LLP

(57) ABSTRACT

A delay circuit includes a delay unit configured to generate a delayed transmission signal by delaying a transmission signal activated when a first signal or a second signal is activated, a signal type storing unit configured to store whether the first signal and the second signal is activated, and a transmitting unit configured to transmits the delayed transmission signal as a first delayed signal or a second delayed signal in response to a value stored in the signal type storing unit.

19 Claims, 6 Drawing Sheets

DELAY CIRCUIT AND DELAY METHOD USING THE SAME

CROSS-REFERENCE TO RELATED APPLICATIONS

The present application claims priority of Korean Patent Application No. 10-2012-0069685, filed on Jun. 28, 2012, which is incorporated herein by reference in its entirety.

BACKGROUND

1. Field

Exemplary embodiments of the present invention relate to a delay circuit and a signal delay method.

2. Description of the Related Art

In the field of integrated circuit, various circuits included in integrated circuits do not operate alone, but operate while exchanging signals (for example, data) with other circuits. In general in order that a circuit A and a circuit B interact with each other, the circuit A requests the circuit B to do an operation, and a predetermined standby time is required until the circuit B operates in response to the request. The standby time is called latency. The reason that the standby time is required is for increase transmission efficiency of signal between the circuit A and the circuit B and ensuring the time for the internal operation of the circuit B.

A memory controller and a memory may be considered as an example of interaction between two or more circuits included in an integrated circuit system. When the memory controller applies a write command to the memory, the memory stores the data input from the memory controller in a memory cell. However, the memory cannot receive the data from the memory controller, upon receiving the write command. This is because the memory needs time to internally prepare for storing the data. The factor defined for the preparation is write latency.

In general, an address for designating the memory cell to store data in is also applied with the write command. However, the data to be stored is input to the memory after the write latency passes from when the write command is applied, so that it is necessary to delay the address for the write latency.

Meanwhile, over DDR2 and DDR3 SDRAM, a new concept, an AL (Additive Latency) has been introduced to increase efficiency of a data bus. Therefore, even if read/write commands or an address is applied from the outside before tRCD (RAS to CAS delay), it is delayed as much as the additive latency, internal read/write commands or an internal address is generated after the tRCD, and a read/write operation of a semiconductor memory device is performed. The additive latency is set by an EMRS, and the additive latency (AL) is fixed at a specific value in the DDR2 SDRAM, but the additive latency (AL) is 0, CL-1, and CL-2, interlocked with the CAS latency (CL). The additive latencies are applied to both read/write commands, and accordingly the address should be delayed as much as the additive latency.

Hereinafter, a delay circuit of a memory which delays a read command or a write command will be described.

FIG. 1 is a diagram illustrating the configuration of a conventional delay circuit.

As illustrated in FIG. 1, the conventional delay circuit includes a first delay unit 110 configured to generate a delayed read command RD_DEL by delaying a read command RD and a second delay unit 120 configured to generate a delayed write command WT_DEL by delaying a write command WT. The delay circuit generates a delayed read command RD_DEL or a delayed write command WT_DEL by delaying a read command RD or a write command WT. It is described when the delay circuit of FIG. 1 generates a delayed read command RD_DEL and a delayed write command WT_DEL by delaying a read command RD and a write command WT within the range of 1 to 7 clock cycles. The range of delay values where the delay circuit can delay the command RD and WT may depend on the design. The delay value of the delay circuit delaying the commands RD and WT may be an additive latency.

Hereinafter, the delay circuit will be described with reference to FIG. 1.

The first delay unit 110 includes a plurality of first shifting units D11 to D18 and a plurality of first selection units S11 to S13, which are connected in series, respectively. The shifting unit. D11 in the first shifting units D11 to D18 outputs an applied read command RD in synchronization with a clock CLK. The shifting units D12 to D18 outputs signals input to them by delaying the signals by one clock cycle in synchronization with the clock CLK. The first shifting units may be D-flip flops.

The first selection units S11 to S13 selects a first shifting unit through which the applied read command RD passes, in the first shifting units D11 to D18 in response to delay information DEL<0:3>. For example, the delay value of the first delay unit 110 is selected as one clock cycle, the selection units S11 to S13 do not pass the applied read command RD through all the shifting units D12 to D17 in response to delay information (DEL<0:3>). Therefore, the read command RD is delayed by one clock cycle by the shifting unit D18 and transmitted as a delayed read command RD_DEL (all the selection units S11, S12 and S13 select and output the signal input to the terminal 0). For example, the delay value of the first delay unit 110 is selected as five clock cycles, the selection units S11 to S13 pass the applied read command RD through all the shifting units D12 to D15 in response to delay information (DEL<0:3>). The output of the shifting unit D15 is transmitted as a delayed read command RD_DEL through the shifting unit D18 (the selection units S11 and S12 select and output the signal input to the terminal 1 and the selection unit S13 selects and outputs the signal input to the terminal 0). For example, the delay value of the first delay unit 110 is selected as six clock cycles, the selection units S11 to S13 pass the applied read command RD through all the shifting units D12 to D16 in response to delay information (DEL<0: 3>). The output of the shifting unit D16 is transmitted as a delayed read command RD_DEL through the shifting unit D18 (all the selection units S11, S12, and S13 select and output the signal input to the terminal 1).

The second delay unit 120 includes a plurality of second shifting units D21 to D28 and a plurality of second selection units S21 to S23, which are connected in series, respectively. The second delay unit 120 has the same configuration and operation as those of the first delay unit 110, except that they generate a delayed write command WT_DEL by delaying a write command WT.

In the delay circuits of the related art, the first delay unit 110 and the second delay unit 120 both include the shifting units D11 to D18 and D21 to D28, respectively, for delaying applied commands RD and WT by one clock cycle. In general, the shifting unit includes a D-flip flop and the D-flip flop occupies a large area and consumes a large amount of current. Therefore, as the first delay unit 110 and the second delay unit 120 each include a plurality of D-flip flops, the area and the consumed current of the delay circuit are large.

SUMMARY

Exemplary embodiments of the present invention are directed to a delay circuit with reduced area and power consumption and a signal delay method using the delay circuit.

In accordance with an embodiment of the present invention, a delay circuit may include a delay unit configured to generate a delayed transmission signal by delaying a transmission signal that is activated when a first signal or a second signal is activated, a signal type storing unit configured to store whether the first signal or the second signal is activated, and a transmitting unit configured to transmit the delayed transmission signal as a first delayed signal or a second delayed signal in response to a value stored in the signal type storing unit.

In accordance with another embodiment of the present invention, a delay unit configured to generate a delayed transmission signal by delaying a transmission signal activated when a first signal or a second signal is activated, a control signal generating unit configured to activate one of input control signals whenever the transmission signal is activated and to activate one of output control signals whenever the delayed transmission signal is activated, a signal type storing unit configured to store whether the first signal or the second signal is activated in response to an activated input control signal of the input control signals, and to output a stored value, which is stored in response to an input control signal corresponding to an activated output control signal, in response to the activated output control signal of the output control signals, and a transmitting unit configured to transmit the delayed transmission signal as a first delayed signal or a second delayed signal in response to an output of the signal type storing unit.

Further, a method of delaying a signal in accordance with an embodiment of the present invention includes: activating a transmission signal when a first signal or a second signal is activated; storing whether one of the first signal or the second signal is activated; generating a delayed transmission signal by delaying the transmission signal; and transmitting the delayed transmission signal as a first delayed signal or a second delayed signal in response a value stored in the storing.

In accordance with another embodiment of the present invention, a method of delaying a signal may include activating a transmission signal when a first signal or a second signal is activated, activating one of input control signals whenever the transmission signal is activated, storing whether the first signal or the second signal is activated in response to the activated input control signal, generating a delayed transmission signal by delaying the transmission signal, activating one of a plurality of output control signals whenever the delayed transmission signal is activated, and transmitting the delayed transmission signal as a first delayed signal or a second delayed signal in response to the value stored when an input control signal, which corresponds to the activated output control signal, is activated. The area and the power consumption of a delay circuit may be reduced by sharing the configuration for delaying two or more different signals.

DETAILED DESCRIPTION

Exemplary embodiments of the present invention will be described below with reference to the accompanying drawings in order for those skilled in the art to be able to easily implement the technical spirit of the present invention.

Figure 1:
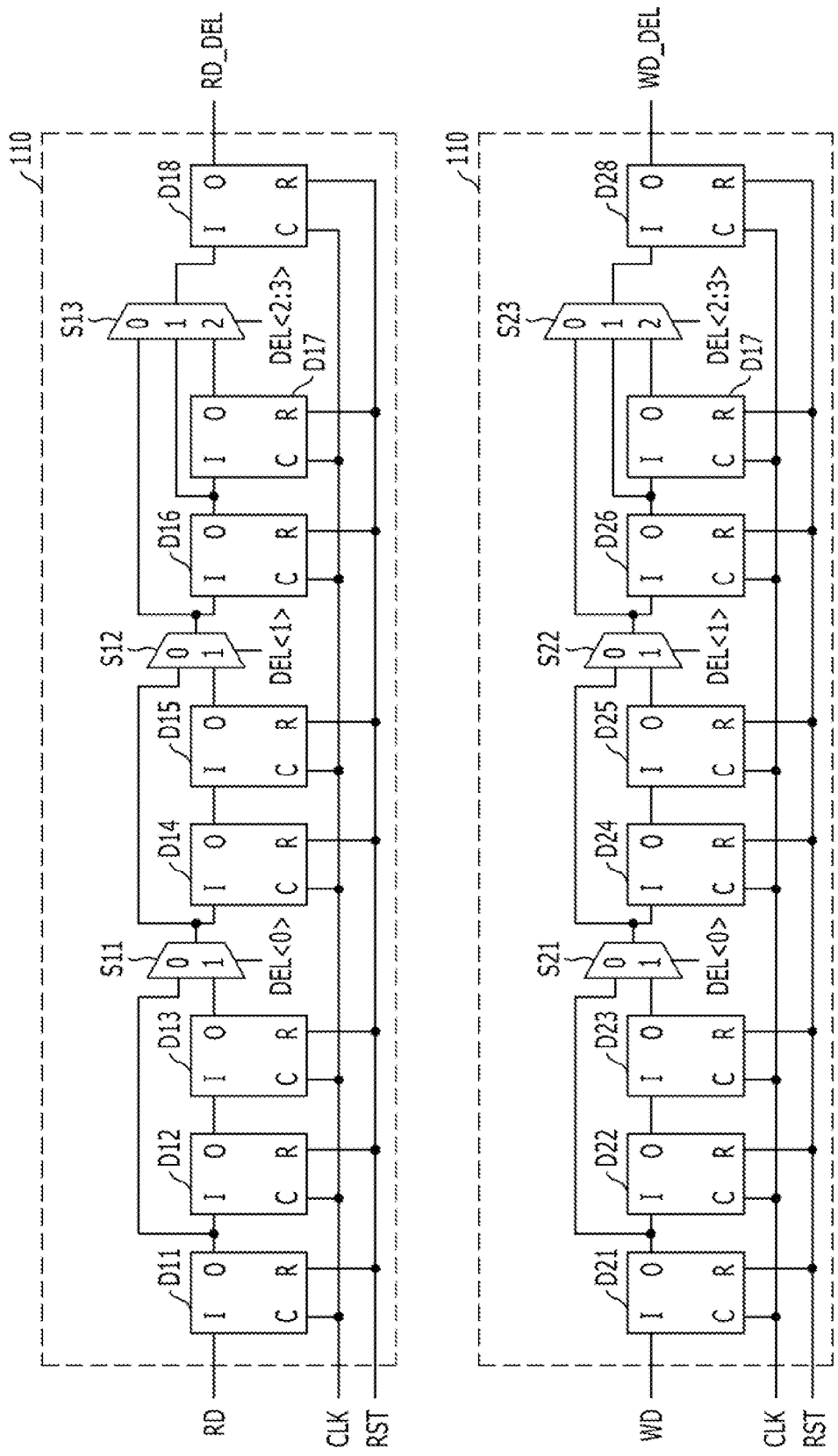
FIG. 1 is a diagram illustrating the configuration of a conventional delay circuit.
Figure 2:
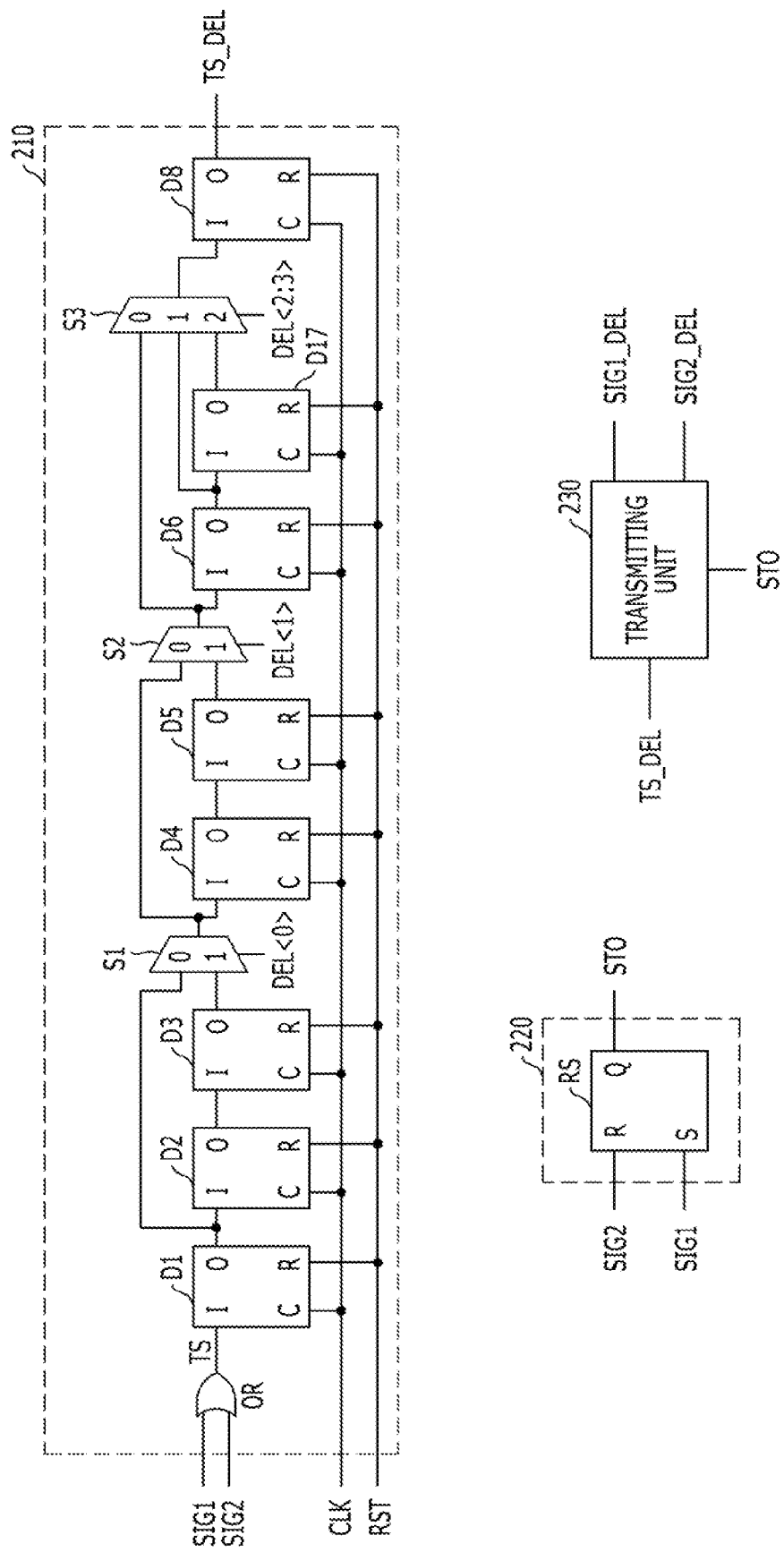
FIG. 2 is a diagram illustrating the configuration of a delay circuit in accordance with an embodiment of the present invention.

FIG. 2 is a diagram illustrating the configuration of a delay circuit in accordance with an embodiment of the present invention.

A delay circuit includes a delay unit 210 configured to output a delayed transmission signal TS_DEL by delaying an activated transmission signal TS when a first signal SIG1 or a second signal SIG2 is activated, a signal type storing unit 220 configured to store whether the first signal SIG1 or the second signal SIG 2 is activated, and a transmitting unit 230 configured to transmit the delayed transmission signal TS_DEL as a first delayed signal SIG1_DEL1 or a second delayed signal SIG2_DEL in response to the value stored in the storing unit 220.

The delay unit 210 generates a delayed transmission signal TS_DEL by delaying a transmission signal TS activated when a first signal SIG1 or a second signal SIG2 is activated, by a delay value determined in response to delay information (DEL<0:3>). The delay circuit in FIG. 2 generates a delayed transmission signal TS_DEL by delaying the transmission signal TS within the range of 1 to 7 clock cycles. The range of delay values where the delay unit 210 may delay the transmission signal TS may depend on the design. For this operation, the delay unit 210 includes an OR-gate a plurality of shifting units D1 to D8, and a plurality of selection units S1 to S3.

When a first signal SIG1 or a second signal SIG2 is activated, the OR-gate activates a transmission signal TS by transmitting the applied signal as a transmission signal TS. The first signal SIG1 and the second signal SIG2 may be pulse signals activated to be high and the transmission signal TS may be a pulse signal with a pulse width the same as that of the applied signal of the first signal SIG1 and the second signal SIG2.

The shifting unit D1 of the shifting units D1 to D8 outputs the activated transmission signal TS in synchronization with a clock CLK. The shifting units D2 to D8 outputs signals input to them by delaying the signals by one clock cycle in synchronization with the clock CLK. The shifting units D1 to D8 each may include a D-flip flop. A reset signal RST is a signal for initializing the values stored in the shifting units D1 to D8.

For reference, in the terminals of the shifting units D1 to D8, 'I' indicates a terminal through which an input signal is input, 'O' indicates a terminal through which an output signal is output, 'C' indicates a terminal through which an enable signal is input for the shifting units to receive the signal input to 'I', and 'R' indicates a terminal for initializing the values stored in the shifting units to specific logic values.

The selection units S1 to S3 select a shifting unit through which the activated transmission signal TS passes, in the shifting units D1 to D8, in response to delay information (DEL<0:3>). The selection unit S1 selects and outputs one of the signal input to the terminal 0 and the signal input to the terminal 1 in response to DEL<0>, the selection unit S2 selects and outputs one of the signal input to the terminal 0 and the signal input to the terminal 1 in response to DEL<1>, and the selection unit S3 selects and outputs one of the signal input to the terminal 0, the signal input to the terminal 1, and the signal input to the terminal 2 in response to DEL<2:3>.

For example, when the delay value of the delay unit 210 is selected as one clock cycle, the selection units S1 to S3 make the activated transmission signal TS not pass all the shifting units D2 to D7, in response to the delay information (DEL<0:3>). Therefore, the transmission signal TS is delayed by one clock cycle by the shifting unit D8 and transmitted as a delayed transmission signal RD_DEL (all the selection units S1, S2, and S3 select and output the signal input to the terminal 0). When the delay value of the delay unit 210 is selected as five clock cycles, the selection units S1 to S3 make the activated transmission signal TS pass all the shifting units D2 to D5, in response to the delay information (DEL<0:3>). The output of the shifting unit D5 is transmitted as a delayed transmission signal TS_DEL through the shifting unit. D8 (the selection units S1 and S2 select and output the signal input to the terminal 1 and the selection unit S3 selects and outputs the signal input to the terminal 0). When the delay value of the delay unit 210 is selected as six clock cycles, the selection units S1 to S3 make the activated transmission signal TS pass all the shifting units D2 to D6, in response to the delay information (DEL<0:3>). The output of the shifting unit D16 is transmitted as a delayed read command RD_DEL through the shifting unit D8 (all the selection units S1, S2, and S3 select and output the signal input to the terminal 1).

The signal type storing unit 220 stores whether the first signal SIG1 or the second signal SIG2 is activated, and outputs the stored value of the delayed transmission signal TS_DEL. The signal type storing unit 220 stores a first value when the first signal SIG1 is activated, and stores a second value inverted from the first value when the second signal SIG2 is activated. The first value may be 'high' or 'low', but it is exemplified in the following description that the first value is 'high' and the second value is 'low', inverted from the first value.

The signal type storing unit 220 stores 'high' when the first signal SIG1 is activated and the transmission signal TS is activated, and stores 'low' when the second signal SIG2 is activated and the transmission signal TS is activated. Further, the signal type storing unit 220 outputs the value stored therein as a signal type signal STO. Therefore, the logic value of the signal type signal STO shows that the transmission signal TS is activated in response to the first signal SIG1 or the second signal SIG2.

The signal type storing unit 220 may include an RS latchet RS configured to input the first signal SIG1 as a set (SET), the second signal SIG2 as a reset (RESET), and have the signal type signal STO as an output. The terminal S is set input terminal, the terminal R is a reset input terminal and the terminal Q is an output terminal.

The transmitting unit 230 transmits the delayed transmission signal TS_DEL as a first delayed signal SIG1_DEL or a second delayed signal SIG2_DEL in response to the value stored in the signal type storing unit 220, that is, the signal type signal STO. The first delayed signal SIG_DEL is a signal obtained by delaying the first signal SIG1 by a delay value determined by the delay information (DEL<0:3>) and the second delayed signal SIG2_DEL is a signal obtained by delaying the second signal SIG2 by a delay value determined by the delay information (DEL<0:3>).

When the signal type signal STO is 'high', the delayed transmission signal TS_DEL is a signal obtained by delaying the transmission signal TS activated in response to the first signal SIG1, so that the transmitting unit 230 transmits the delayed transmission signal TS_DEL as the first delayed signal SIG1_DEL. In contrast, when the signal type signal STO is 'low', the delayed transmission signal TS_DEL is a signal obtained by delaying the transmission signal TS activated in response to the second signal SIG2, so that the transmitting unit 230 transmits the delayed transmission signal TS_DEL as the second delayed signal SIG2_DEL.

As the first signal SIG1 is activated, the transmission signal TS is activated and the delay unit 210 generates a delayed transmission signal TS by delaying the transmission signal TS by the delay value determined by the delay information (DEL<0:3>). The storing unit 220 stores 'high' and outputs a signal type signal STO of 'high', because the first signal SIG1 has been applied. The transmitting unit 230 transmits the delayed transmission signal TS_DEL as the first delayed signal SIG1 in response to 'high' state of the signal type signal STO.

Next, as the second signal SIG2 is activated, the transmission signal TS is activated and the delay unit 210 generates a delayed transmission signal TS by delaying the transmission signal TS by the delay value determined by the delay information (DEL<0:3>). The storing unit 220 stores 'low' and outputs a signal type signal STO of 'low' because the second signal SIG2 has been applied. The transmitting unit 230 transmits the delayed transmission signal TS_DEL as the second delayed signal SIG2 in response to 'low' state of the signal type signal STO.

The first signal SIG1 and the second signal SIG2 may be a read command and a write command, respectively, and the delay information (DEL<0:3>) may be information about latency (particularly, additive latency).

Figure 3:
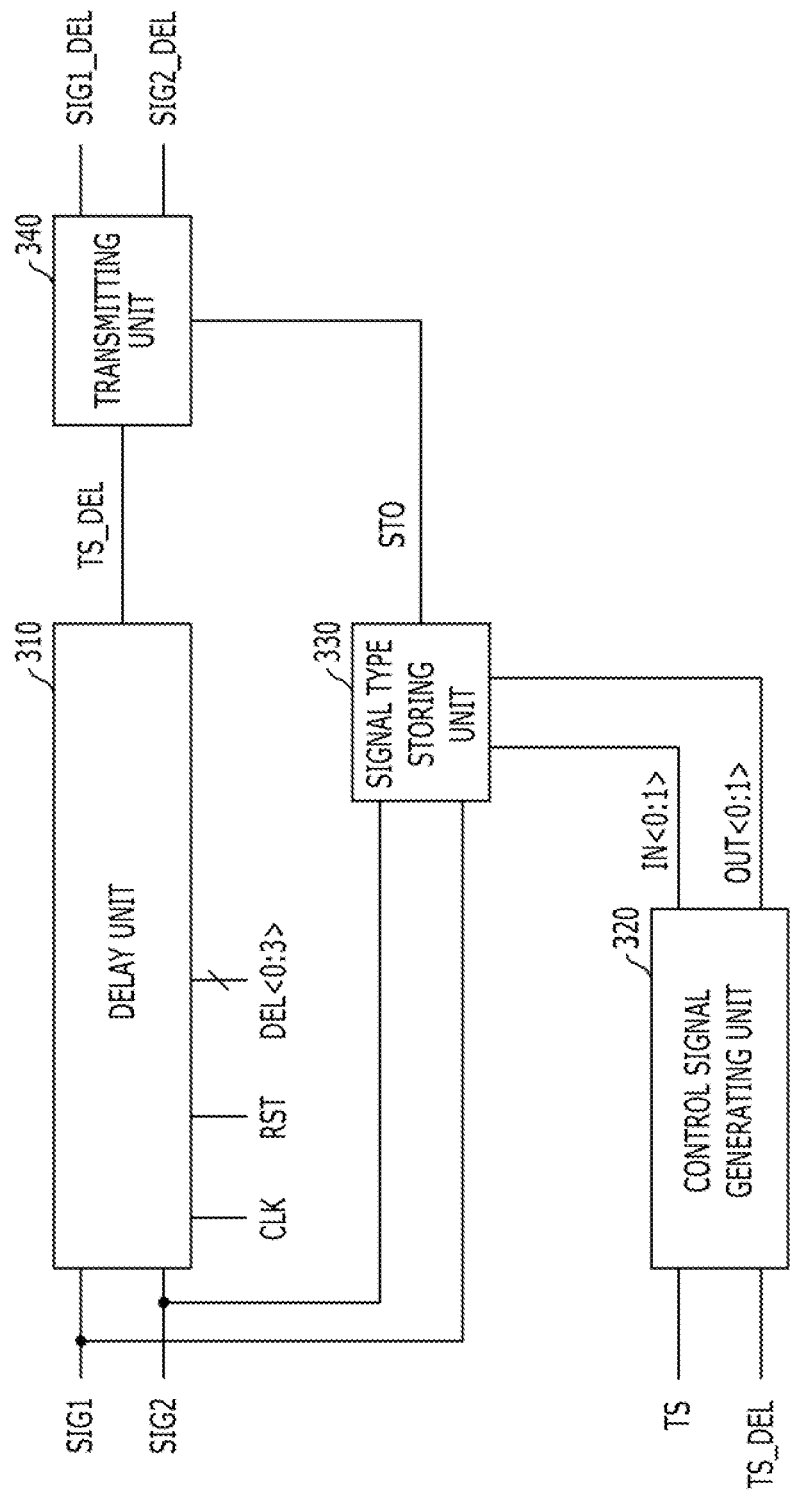
FIG. 3 is a diagram illustrating the configuration of a delay circuit in accordance with another embodiment of the present invention.

The delay circuit in accordance with an embodiment of the present invention may delay signals, using the same delay unit, even if the types of the signals are different, by storing the types of the signals applied to be delayed. Therefore, the area, current consumption, and power consumption of the circuit may be reduced. Considering the example of FIG. 2, a delay unit corresponding to each signal is required to delay the first signal SIG2 and the second signal SIG2 in the related art, but it is possible to delay both the first signal SIG1 and the second signal SIG2, using one delay unit, by storing whether the first signal SIG1 or the second signal SIG2 is activated. FIG. 3 is a diagram illustrating the configuration of a delay circuit in accordance with another embodiment of the present invention. FIG. 3 illustrates a delayed signal for delaying a signal applied to one delay unit regardless of the signal type of the signal, even though a first signal SIG1 and a second signal SIG2 are sequentially applied with a predetermined interval and the delay unit simultaneously delays two or more signals.

As illustrated in FIG. 3, the delay circuit includes a delay unit 310 configured to generate a delayed transmission signal TS_DEL by delaying a transmission signal TS that is activated when a first signal SIG1 or a second signal SIG2 is activated, a control signal generating unit 320 configured to activate one of input control signals (IN<0:1>) whenever the transmission signal TS is activated, and to activate one of output control signals (OUT<0:1>) whenever the delayed transmission signal TS_DEL is activated, a signal type storing unit 330 configured to store whether the first signal SIG1 or the second signal SIG2 is activated in response to the activated input control signal of the input control signals (IN<0:1>) and to output a value stored when an input signal corresponding to the activated output control signal of the input control signals (IN<0:1>) in response to an activated output control signal of the output control signals (OUT<0:1>), and a transmitting unit 340 configured to transmit the delayed transmission signal TS_DEL as a first delayed signal SIG1_DEL or a second delayed signal SIG2_DEL in response to the output of the signal type storing unit 330.

The delay unit 310 of the delay circuit of FIG. 3 has the same configuration and operation as those of the delay unit 210 of the delay circuit of FIG. 2. Therefore, the delay unit 310 generates a delayed transmission signal TS_DEL by delaying the transmission signal TS by a delay value determined by the delay information (DEL<0:3>). The shifting unit D8 of the shifting units D1 to D8 outputs the delayed transmission signal TS_DEL to the terminal 'O'.

The signal type storing unit 330 stores whether the first signal SIG1 or the second signal SIG2 is activated, when a input control signal is activated, and outputs the value stored when an input control signal corresponding to an activated output control signal, when the output control signal is activated. For example, it is assumed that 'IN<0>' corresponds to 'OUT<0>' and 'IN<1>' corresponds to 'OUT<1>'. When the second signal SIG2 is activated at a first time point, the signal type storing unit 330 stores 'low', when 'IN<0>' is activated. When the first signal SIG1 is activated at a second time point after the first time point, the signal type storing unit 330 stores 'high', when 'IN<1>' is activated. Thereafter, when the delayed transmission signal TS_DEL obtained by delaying the transmission signal TS activated in response to the second signal SIG2 applied at the first time point is activated, the 'OUT<0>' is activated and the signal type storing unit 330 outputs the 'low' stored when the 'IN<0>' corresponding to the 'OUT<0>' is activated. Thereafter, when the delayed transmission signal TS_DEL obtained by delaying the transmission signal TS activated in response to the first signal SIG1 applied at the first time point is activated, the 'OUT<1>' is activated and the signal type storing unit 330 outputs the 'high' stored when the 'IN<0>' corresponding to the 'OUT<0>' is activated.

Figure 4:
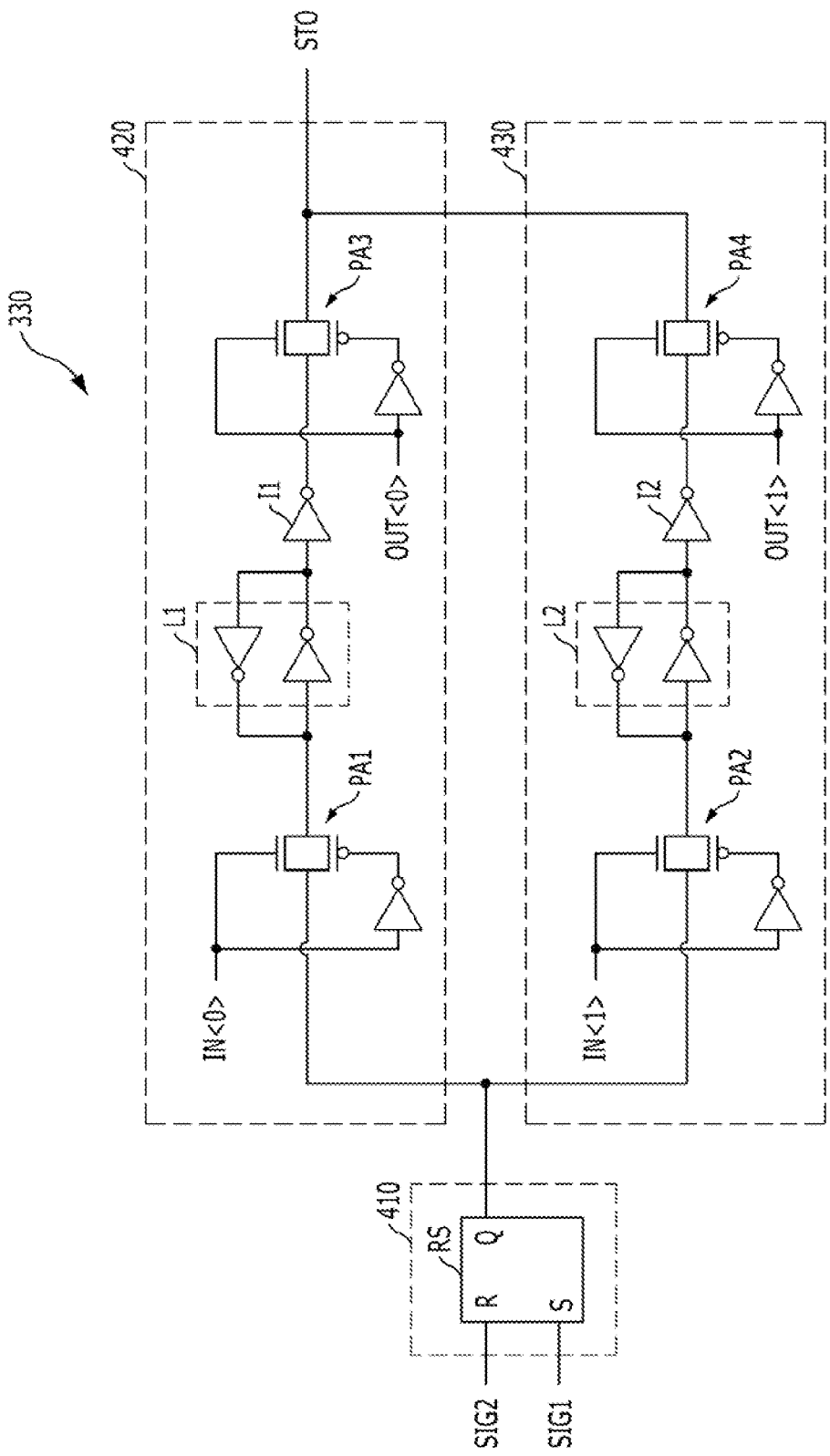
FIG. 4 is a detailed diagram illustrating the configuration of a signal type storing unit shown in FIG. 3.

FIG. 4 is a detailed diagram illustrating the configuration of the signal type storing unit 330 shown in FIG. 3.

For the operation described above, the signal type storing unit 330 includes a signal type output unit 410 configured to output whether the first signal SIG1 or the second signal SIG2 is activated, and a plurality of unit storing units 420 and 430 configured to store whether the first signal SIG1 or the second signal SIG2 is activated, when an input control signal corresponding to them in input control signals (IN<0:1>) is activated, and to output stored in them, when an output control signal corresponding to them in a plurality if output control signals (OUT<0:1>). FIG. 4 illustrates the type storing unit 330 that may store two different values, including the two unit storing units 420 and 430. The number of unit storing units included in the signal type storing unit 330 may depend on the design, but the more the number of the unit storing units, the more the number of values that the signal type storing unit 330 may store.

The signal type output unit 410 outputs a first value, when the applied signal is the first signal SIG1, and outputs a second value inverted from the first value, when the applied signal is the second signal SIG2. The first value may be 'high' and the second value may be 'low', and vice versa. It is described below when the first value is 'high' and the second value is 'low'. In this case, the signal type output 410 may include an RS latchet RS configured to input the first signal SIG1 as a set and input the second signal as a reset. In FIG. 4, the signal type output unit 410 outputs 'high' when the first signal SIG1 is activated, and outputs 'low' when the second signal SIG2 is activated.

The first unit storing unit 420 corresponds to 'IN<0>' and 'OUT<0>'. Therefore, the first unit storing unit 420 stores the output of the signal type output unit 410, when the 'IN<0>' is activated, and outputs the stored value as a signal type signal ST0 when the 'OUT<0>' is activated. For this operation, the first unit storing unit 420 includes a pass gate PA1 configured to pass the output of the signal type output unit 410 when the 'IN<0>' is activated, a latchet L1 configured to store the input value, an inverter I1, and a pass gate PA3 configured to pass the stored value, when the 'OUT<0>' is activated.

The second unit storing unit 430 corresponds to 'IN<1>' and 'OUT<1>'. Therefore, the second unit storing unit 430 stores the output of the signal type output unit 410, when the 'IN<1>' is activated, and outputs the stored value as a signal type signal ST0 when the 'OUT<1>' is activated. For this operation, the second unit storing unit 430 includes a pass gate PA2 configured to pass the output of the signal type output unit 410 when the 'IN<1>' is activated, a latchet L2 configured to store the input value, an inverter I2, and a pass gate PA4 configured to pass the stored value, when the 'OUT<1>' is activated.

The control signal generating unit 320 generates input control signals (IN<0:1>) and output control signals (OUT<0:1>) to control the signal type storing unit 330. It activates one of the input control signals (IN<0:1>) whenever the transmission signal TS is activated, and activates one of the output control signals (OUT<0:1>) whenever the delayed transmission signal TS_DEL is activated.

Figure 5:
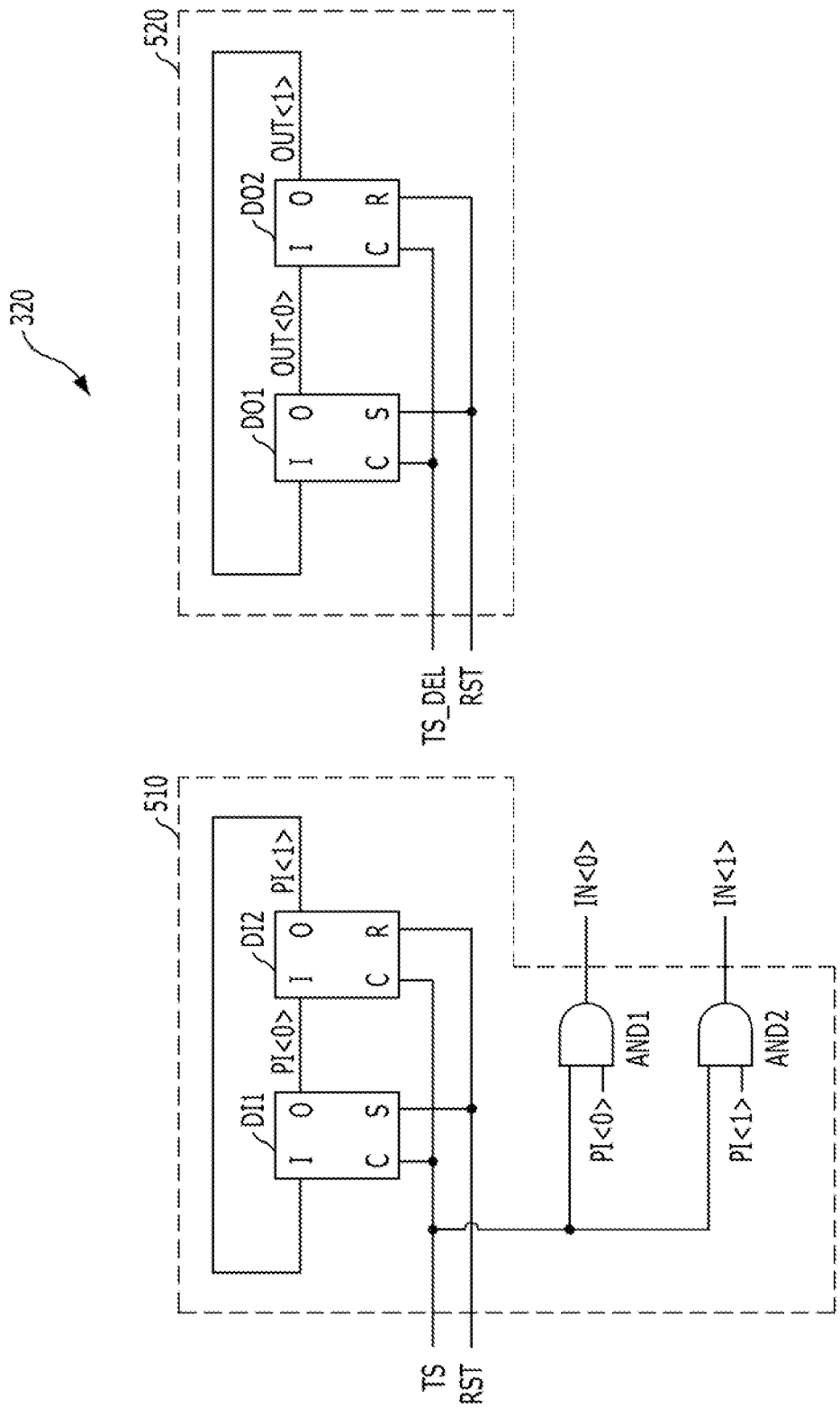
FIG. 5 is a detailed diagram illustrating the configuration of a control signal generating unit shown in FIG. 3.

FIG. 5 is a detailed diagram illustrating the configuration of the control signal generating unit 320 shown in FIG. 3.

For the operation described above, the control signal generating unit 320 includes an input control signal generating unit 511 configured to activate one of a plurality of input control signals (IN<0:1>) whenever the transmission signal TS is activated while generating the input control signals (IN<0:1>), and an output control signal generating unit 520 configured to activate one of a plurality of output control signals (OUT<0:1>) whenever the delayed transmission signal TS_DEL is activated while generating the output control signals (OUT<0:1>).

The input control signal generating unit 510 activates one of the input control signals (IN<0:1>) whenever the transmission signal TS is activated in response to the transmission signal TS. For this operation, the input control signal generating unit 510 includes a plurality of first shifting units DI1 and DI2 connected in series and configured to store a first value or a second value, when a reset signal RST is applied, and shift the values stored therein whenever the transmission signal is activated, and a signal generating unit 511 configured to generate a plurality of input control signals (IN<0:1>) in response to the transmission signal TS and the outputs (PI<0:1>) of the first shifting units.

When the reset signal RST is activated, the value and the output stored in the shifting unit DI1 are initialized to 'high' and the value and output stored in the shifting unit DI2 are initialized to 'low'. That is, the outputs (PI<0:1>) of the first shifting units are initialized to (P<0>, P<1>)=(1,0). When the first signal SG1 or the second signal SIG2 is activated and the transmission signal TS is activated, the signal generating unit 511 generates a plurality of input control signals (IN<0:1>) by combining the outputs (PI<0:1>) of the first shifting units with the transmission signal TS. Since (P<0>, P<1>)=(1,0) is satisfied, with the transmission signal TS activated, the activated transmission signal TS is transmitted to 'IN<0>' and the 'IN<0>' is activated.

When the transmission signal TS is activated, the shifting unit. DI1 receives the output (PI<1>) of the shifting unit DI2 and the value stored in the shifting unit DI1 changes to 'low' from 'high, and the shifting unit DI2 receives the output (PI<0>) of the shifting unit DI1 and the value stored in the shifting unit DI2 changes to 'high' from 'low'. When the transmission signal TS is inactivated after the period where the transmission signal TS is activated, the output (PI<0>) of the shifting unit DI1 changes to 'low' from 'high' and the output (PI<1>) of the shifting unit DI2 changes to 'high' from 'low'. Next, since (P<0>, P<1>)=(0,1) is satisfied when the first signal SIG1 or the second signal SIG2 is activated and the transmission signal TS is activated, the signal generating unit 511 transmits the transmission signal TS to 'IN<1>' and the 'IN<1>' is activated.

The operation described above is repeated whenever the transmission signal TS is activated, and for this operation, the signal generating unit 511 includes two AND-gates AND1 and AND2.

The output control signal generating unit 520 activates one of the output control signals (OUT<0:1>) whenever the delayed transmission signal TS_DEL is activated in response to the delayed transmission signal TS_DEL. For this operation, the output control signal generating unit 510 includes a plurality of second shifting units DO1 and DO2 connected in series, configured to store the first value or the second value when the reset signal RST is activated, and shift the values stored therein whenever the delayed transmission signal TS_DEL is activated.

When the reset signal RST is activated, the value and the output stored in the shifting unit DO1 are initialized to 'high' and the value and output stored in the shifting unit DO2 are initialized to 'low'. That is, the outputs (OUT<0:1>) of the first shifting units are initialized to (OUT<0>, OUT<1>)=(1, 0). Therefore, the 'OUT<0>' is activated. When the delayed transmission signal TS_DEL is activated, the shifting unit DO1 receives the output (OUT<1>) of the shifting unit DO2 and the value stored in the shifting unit DI1 changes to 'low' from 'high, and the shifting unit DO2 receives the output (OUT<0>) of the shifting unit DO1 and the value stored in the shifting unit DO2 changes to 'high' from 'low'.

When the delayed transmission signal TS_DEL is inactivated after the period where the delayed transmission signal TS_DEL is activated, the output (OUT<0>) of the shifting unit DO1 changes to 'low' from 'high' and the output (OUT<1>) of the shifting unit DO2 changes to 'high' from 'low'. Therefore, the 'OUT<1>' is activated. Next, the 'OUT<0>' is activated again, when the delayed transmission signal TS_DEL is activated. The operation described above is repeated whenever the delayed transmission signal TS_DEL is activated.

The transmitting unit 340 of the delay circuit of FIG. 3 has the same configuration and operation as those of the delay unit 230 of the delay circuit of FIG. 2. Therefore the transmitting unit 340 transmits the delayed transmission signal TS_DEL as a first delayed signal SIG1_DEL or a second delayed signal SIG2_DEL in response to the value output from the signal type storing unit 330. In more detail, when the value output from the signal type storing unit 330 is the first value, the delayed transmission signal TS_DEL is transmitted as a first delayed signal SIG1_DEL, and when the value output from the signal type storing unit 330 is the second value, the delayed transmission in signal TS_DEL is transmitted as a second delayed signal SIG2_DEL.

The first signal SIG1 and the second signal SIG2 may be a read command and a write command, respectively, and the delay information (DEL<0:3>) may be information about latency (particularly, additive latency).

The delay circuit in accordance with an embodiment of the present invention may delay signals, using the same delay unit, even if the types of the signals are different, by storing the types of the signals applied to be delayed. Therefore, the area, current consumption, and power consumption of the circuit may be reduced.

For reference, in the description above, the input control signals (IN<0:1>) and the output control signals (OUT<0:1>) are all signals that are activated to 'high'. The input control signals (IN<0:1>) may be pulse signals that are activated during the period where the transmission signal TS is activated, and the output control signals (OUT<0:1>) may be signals that keep activated until the delayed transmission signal TS_DEL is activated. Further, the first shifting units DI1 and DI2 and the second shifting units DO1 and DO2 may shift the value stored therein in response to signals that are inactivated later than the transmission signal TS and the delayed transmission signal TS_DEL in order to ensure a margin.

Figure 6:
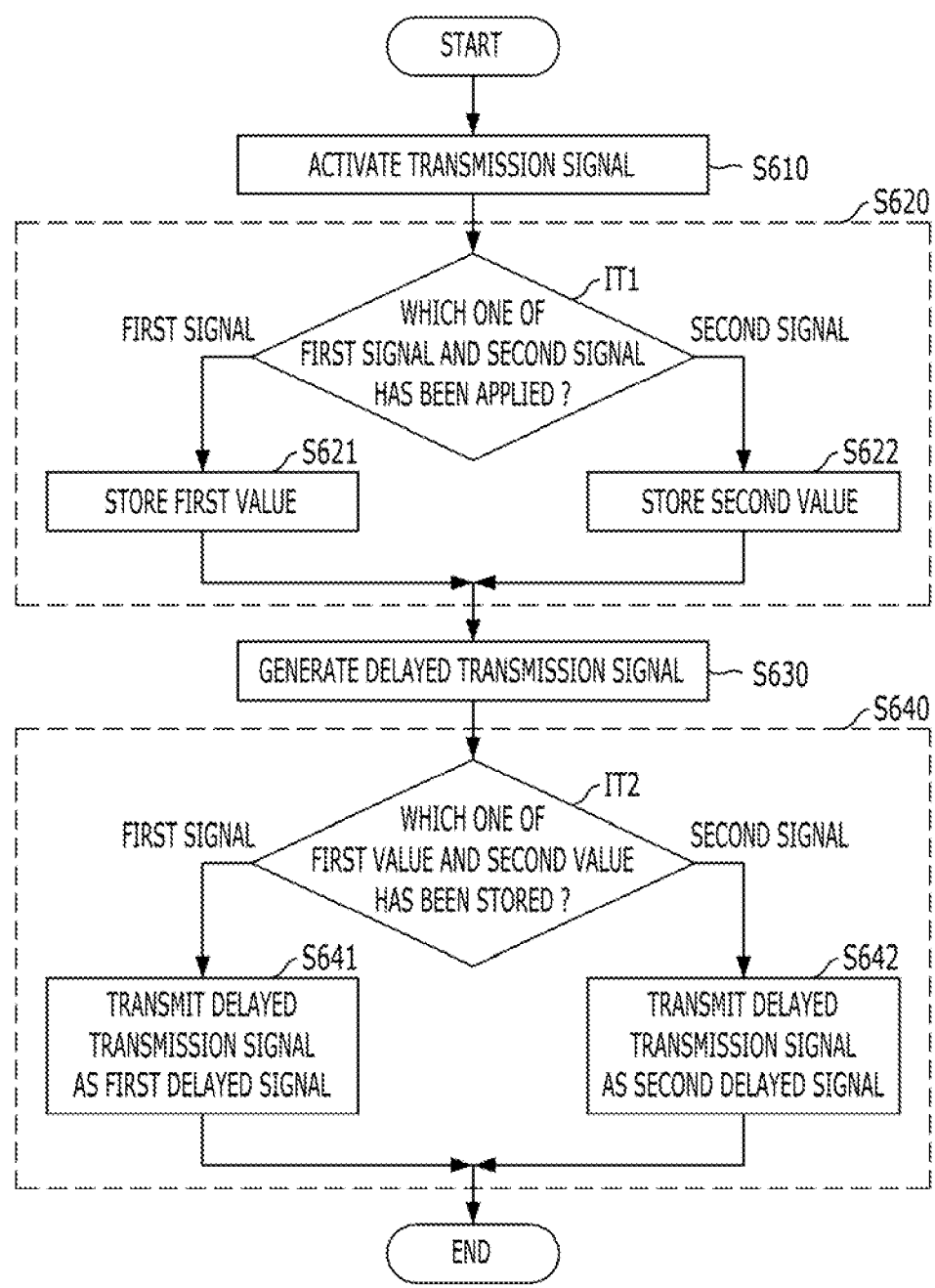
FIG. 6 is a flowchart illustrating a signal delay method in accordance with another embodiment of the present invention

FIG. 6 is a flowchart illustrating a signal delay method in accordance with another embodiment of the present invention.

As illustrated in FIG. 6, a method of delaying a signal includes activating a transmission signal TS when a first signal SIG1 or a second signal SIG2 is activated (S610, hereinafter referred at as a transmission signal activating step (S610)), storing whether the first signal SIG1 or the second signal SIG2 is activated (S620, hereinafter referred to as a storing step (S620)), generating a delayed transmission signal TS_DEL by delaying the transmission signal TS (S630, hereinafter referred to as a delaying step (S630)), and transmitting the delayed transmission signal TS_DEL as a first delayed signal SIG1_DEL or a second delayed signal SIG2_DEL in response to the value stored in the storing step (S620) (hereinafter, referred to as a transmitting step (S640)).

The method of delaying a signal is described in detail with reference to FIGS. 2 and 6.

When a signal starts to be delayed, the first signal SIG1 or the second signal SIG2 is activated. In the transmission signal activating step (S610), when the first signal SIG1 or the second signal SIG2 is activated, the transmission signal TS is activated.

In the storing step (S620), whether the first signal SIG1 or the second signal SIG2 is activated is stored in the storing unit 220. The value to be stored in the storing unit 220 depends on whether the first signal SIG1 or the second signal SIG2 is activated at 'IT1'. When the first signal SIG1 is activated, the second value is stored in the signal type storing unit 220 along the 'first signal' path (S621). When the second signal SIG2 is activated, the second value is stored in the signal type storing unit 220 along the 'second signal' path.

Meanwhile, in the delaying step (S630), the delay unit 210 generates a delayed transmission signal TS_DEL by delaying the transmission signal through a delay unit 310 to the delay value determined in response to the delay information (DEL<0:3>).

In the transmitting step (S640), the transmitting unit 230 transmits the delayed transmission signal TS_DEL as a first delayed signal SIG1_DEL or a second delayed signal SIG2_DEL in response to the value stored in the signal type storing unit 220 in the storing step (S620). Transmitting the delayed transmission signal TS_DEL as one of the first delayed signal SIG1_DEL or the second delayed signal SIG2_DEL depends on the value stored in the signal type storing unit 220 in the storing step (S620), at 'IT2'. Since the signal to be delayed is the first signal SIG1 when the value stored in the storing step (S620) is the first value, the transmitting unit 230 transmits the delayed transmission signal TS_DEL as the first delayed signal SIG1_DEL along the 'first value' path. Since the signal to be delayed is the second signal SIG2 when the value stored in the storing step (S620) is the second value, the transmitting unit 230 transmits the delayed transmission signal TS_DEL as the second delayed signal SIG2_DEL along the 'second value' path.

The method of delaying a signal has the same efficiency as that of the delay circuit of FIG. 2.

A method of delaying a signal using the delay circuit of FIG. 3 is described with reference to FIG. 6.

The method of delaying a signal includes activating a transmission signal TS when a first signal SIG1 or a second signal SIG2 is activated (hereinafter, referred to as a transmission signal activating step) activating one of a plurality of input control signals (IN<0:1>) whenever the transmission signal TS is activated (hereinafter, referred to as an input control signal activating step) storing whether the first signal SIG1 or the second signal SIG2 is activated in response to the activated input control signal (hereinafter, referred to as a storing step), generating a delayed transmission signal TS_DEL by delaying the transmission signal TS (hereinafter, referred to as a delaying step), activating one of a plurality of output control signals (OUT<0:1>) whenever the delayed transmission signal TS_DEL is activated (hereinafter, referred to as an output control signal activating step), and transmitting the delayed transmission signal TS_DEL as a first delayed signal SIG1_DEL or a second delayed signal SIG2_DEL in response to the value stored when an input control signal, which corresponds to the activated output control signal, of the input control signals (IN<0:1>) is activated (hereinafter, referred to as a transmitting step).

When a signal starts to be delayed, the first signal SIG1 or the second signal SIG2 is activated. In the transmission signal activating step, when the first signal SIG1 or the second signal SIG2 is activated, the transmission signal TS is activated.

In the input control signal activating step, the input control signal generating unit 510 of the control signal generating unit 320 activates one of the input control signals (IN<0:1>) whenever the transmission signal TS is activated. The input control signal determines to store in the unit storing units 420 or 430 whether the first signal SIG1 or the second signal SIG2 is activated. In the storing step, whether the first signal SIG1 or the second signal SIG2 is activated is stored in the storing unit 330. The value to be stored in the storing unit 330 depends on whether the first signal SIG1 or the second signal SIG2 is activated. When the first signal SIG1 is activated, the second value is stored in the signal type storing unit 330. When the second signal SIG2 is activated, the second value is stored in the signal type storing unit 330. The value is stored in the unit storing unit corresponding to the activated input control signal in the unit storing units 420 and 430 included in the signal type storing unit 330.

Meanwhile, in the delaying step, the delay unit 310 generates a delayed transmission signal TS_DEL by delaying the transmission signal through a delay unit to the delay value determined in response to the delay information (DEL<0:3>).

In the output control signal activating step, the output control signal generating unit 520 of the control signal generating unit 320 activates one of the output control signals (OUT<0:1>) whenever the delayed transmission signal TS_DEL is activated. The output control signal is used to determine to output the value stored in the unit storing units 420 or 430. In the transmitting step, the transmitting unit 340 transmits the delayed transmission signal TS_DEL as a first delayed signal SIG1_DEL or a second delayed signal SIG2_DEL in response to the value stored in the signal type storing unit 330 in the storing step. Transmitting the delayed transmission signal TS_DEL as one of the first delayed signal SIG1_DEL or the second delayed signal SIG2_DEL depends on the value output from the signal type storing unit 330. Since the signal to be delayed is the first signal SIG1 when the value output from the signal type storing unit 330 is the first value, the transmitting unit 340 transmits the delayed transmission signal TS_DEL as the first delayed signal SIG1_DEL. Since the signal to be delayed is the second signal SIG2 when the value output from the signal type storing unit 330 is the second value, the transmitting unit 340 transmits the delayed transmission signal TS_DEL as the second delayed signal SIG2_DEL.

While the present invention has been described with respect to the specific embodiments, t will be apparent to those skilled in the art that various changes and modifications may be made without departing from the spirit and scope of the invention as defined in the following claims.

What is claimed is:

1. A delay circuit comprising:
   a delay unit configured to generate a delayed transmission signal by delaying a transmission signal that is activated when a first signal or a second signal is activated;
   a signal type storing unit configured to store whether the first signal or the second signal is activated; and
   a transmitting unit configured to transmit the delayed transmission signal as a first delayed signal or a second delayed signal in response to a value stored in the signal type storing unit.

2. The delay circuit of claim 1, wherein the signal type storing unit stores a first value when the first signal is applied, and stores a second value inverted from the first value when the second signal is activated.

3. The delay circuit of claim 1, wherein the transmitting unit transmits the delayed transmission signal as the first delayed signal when the value stored in the signal type storing unit is the first value, and transmits the delayed transmission signal as the second delayed signal when the value stored in the signal type storing unit is the second value.

4. The delay circuit of claim 1, wherein the delay unit delays the transmission signal by a delay value determined in response to delay information.

5. The delay circuit of claim 4, wherein the first signal is a read command, the second signal is a write command, and the delay information is latency information.

6. A delay circuit comprising:
   a delay unit configured to generate a delayed transmission signal by delaying a transmission signal that is activated when a first signal or a second signal is activated;
   a control signal generating unit configured to activate one of input control signals whenever the transmission signal is activated and to activate one of output control signals whenever the delayed transmission signal is activated;
   a signal type storing unit configured to store whether the first signal or the second signal is activated in response to an activated input control signal of the input control signals, and to output a stored value, which is stored in response to an input control signal corresponding to an activated output control signal, in response to the activated output control signal of the output control signals; and a transmitting unit configured to transmit the delayed transmission signal as a first delayed signal or a second delayed signal in response to an output of the signal type storing unit.

7. The delay circuit of claim 6, wherein the signal type storing unit stores a first value when the first signal is activated, and stores a second value inverted from the first value when the second signal is activated.

8. The delay circuit of claim 6, wherein the transmitting unit transmits the delayed transmission signal as the first delayed signal when the output of the signal type storing unit is the first value, and transmits the delayed transmission signal as the second delayed signal when the output of the signal type storing unit is the second value.

9. The delay circuit of claim 6, wherein the control signal generating unit includes:
an input control signal generating unit configured to generate the input control signals and to activate one of the input control signals whenever the transmission signal is activated; and
an output control signal generating unit configured to generate the output control signals and to activate one of the output control signals whenever the delayed transmission signal is activated.

10. The delay circuit of claim 9, wherein the input control signal generating unit includes:
a plurality of first shifting units connected in series and configured to store the first value or the second value when a reset signal is activated and to shift the values stored therein whenever the transmission signal is activated; and
a signal generating unit configured to generate a plurality of input control signals in response to the transmission signal and the outputs of the first shifting units.

11. The delay circuit of claim 9, wherein the output control signal generating unit includes a plurality of second shifting unit connected in series and configured to store the first value or the second value when the reset signal is activated, and to shift the value stored therein whenever the delayed transmission signal is activated, and the outputs of the second shifting units are a plurality of output control signals.

12. The delay circuit of claim 6, wherein the signal type storing unit includes a plurality of unit storing units configured to store whether the first signal or the second signal is activated when an input control signal of the input control signals is activated, and to output the value stored therein when an output control signal of the output control signals is activated.

13. The delay circuit of claim 6, wherein the delay unit delays the transmission signal by a delay value determined in response to delay information.

14. A method of delaying a signal comprising:
activating a transmission signal when a first signal or a second signal is activated;
storing whether one of the first signal or the second signal is activated;
generating a delayed transmission signal by delaying the transmission signal; and
transmitting the delayed transmission signal as a first delayed signal or a second delayed signal in response a value stored in the storing.

15. The method of claim 14, wherein the storing stores a first value when the first signal is activated, and stores a second value inverted from the first value when the second signal is activated.

16. The method of claim 14, wherein the transmitting transmits the delayed transmission signal as the first delayed signal when the value stored in the storing is the first value, and transmits the delayed transmission signal as the second delayed signal when the output of the signal type storing unit is the second value.

17. A method of delaying a signal comprising:
activating a transmission signal when a first signal or a second signal is activated;
activating one of input control signals whenever the transmission signal is activated;
storing whether the first signal or the second signal is activated in response to the activated input control signal;
generating a delayed transmission signal by delaying the transmission signal;
activating one of a plurality of output control signals whenever the delayed transmission signal is activated; and
transmitting the delayed transmission signal as a first delayed signal or a second delayed signal in response to the value stored when an input control signal, which corresponds to the activated output control signal, is activated.

18. The method of claim 17, wherein the storing stores a first value when the first signal is activated, and stores a second value inverted from the first value when the second signal is activated.

19. The method of claim 17, wherein the transmitting transmits the delayed transmission signal as the first delayed signal when the value stored in the storing is the first value, and transmits the delayed transmission signal as the second delayed signal when the output of the signal type storing unit is the second value.

* * * * *